United States Patent
Ogawa

(10) Patent No.: US 12,187,528 B2
(45) Date of Patent: Jan. 7, 2025

(54) SUBSTRATE STORAGE CONTAINER

(71) Applicant: Shin-Etsu Polymer Co., Ltd., Tokyo (JP)

(72) Inventor: Osamu Ogawa, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 322 days.

(21) Appl. No.: 17/640,334

(22) PCT Filed: Aug. 7, 2020

(86) PCT No.: PCT/JP2020/030392
§ 371 (c)(1),
(2) Date: Mar. 4, 2022

(87) PCT Pub. No.: WO2021/044804
PCT Pub. Date: Mar. 11, 2021

(65) Prior Publication Data
US 2022/0324634 A1 Oct. 13, 2022

(30) Foreign Application Priority Data

Sep. 5, 2019 (JP) .................................. 2019-161871

(51) Int. Cl.
*H01L 21/673* (2006.01)
*B08B 9/093* (2006.01)
*B65D 85/30* (2006.01)

(52) U.S. Cl.
CPC .............. *B65D 85/30* (2013.01); *B08B 9/093* (2013.01); *H01L 21/67386* (2013.01); *B08B 2209/08* (2013.01)

(58) Field of Classification Search
CPC .......... H01L 21/6735; H01L 21/67379; H01L 21/67386; H01L 21/67389; H01L 21/67393
See application file for complete search history.

(56) References Cited

U.S. PATENT DOCUMENTS

2021/0148479 A1  5/2021  Ogawa

FOREIGN PATENT DOCUMENTS

| JP | 2016004949 A | * | 1/2016 |
| JP | 6265844 | | 1/2018 |
| WO | 2019012926 | | 1/2019 |

OTHER PUBLICATIONS

Machine Translation of Fujimoto et al., JP-2016004949-A, Jan. 2016. (Year: 2016).*
"International Search Report (Form PCT/ISA/210) of PCT/JP2020/030392," mailed on Nov. 2, 2020, with English translation thereof, pp. 1-4.
"Written Opinion of the International Searching Authority (Form PCT/ISA/237)" of PCT/JP2020/030392, mailed on Nov. 2, 2020, with English translation thereof, pp. 1-6.

* cited by examiner

*Primary Examiner* — David G Cormier
(74) *Attorney, Agent, or Firm* — JCIP GLOBAL INC.

(57) ABSTRACT

A substrate storage container includes: an opening on a front surface side; and a gas supply mechanism on a bottom surface. The gas supply mechanism has: an introduction path configured to receive a gas from a bottom surface side; a check valve disposed at a position that does not overlap with the introduction path in a horizontal plane along the bottom surface; and a flow path configured to supply the gas from the introduction path to the check valve.

7 Claims, 8 Drawing Sheets

SUBSTRATE STORAGE CONTAINER

CROSS-REFERENCE TO RELATED APPLICATION

This application is a 371 application of the International PCT application serial no. PCT/JP2020/030392, filed on Aug. 7, 2020, which claims the priority benefit of Japan Patent Application No. 2019-161871, filed on Sep. 5, 2019. The entirety of each of the above-mentioned patent applications is hereby incorporated by reference herein and made a part of this specification.

TECHNICAL FIELD

The present disclosure relates to a substrate storage container for storing substrates.

BACKGROUND ART

Substrate storage containers for storing substrates such as semiconductor wafers are used for storage of the substrates in warehouse or transportation of the substrates between semiconductor processing apparatuses or between factories. The substrate storage containers are configured such that the air in its interior space can be replaced with an inert gas such as nitrogen gas or dry air sent from a gas replacement device to prevent oxidation or contamination of the substrates stored in the interior space or to keep the humidity constant in the interior space. The substrate storage containers are provided with gas supply mechanisms on a bottom surface thereof for introduction of the gas sent from the gas replacement device.

Citation List

Patent Literature

Patent Literature 1: Japanese Patent No. 6265844

SUMMARY OF INVENTION

Technical Problem

Prior to storing the substrates, the substrate storage container is cleaned by a dedicated cleaning device in advance. This cleaning process includes a process of spraying a cleaning liquid (water) to the substrate storage container and a process of drying the cleaning liquid remaining on surfaces of the substrate storage container. However, conventional substrate storage containers have a problem that the cleaning liquid tends to remain in the gas supply mechanism provided in the bottom surface in the cleaning process.

This disclosure provides a substrate storage container configured such that a cleaning liquid does not readily remain in a gas supply mechanism.

Solution to Problem

In one aspect of the disclosure, a substrate storage container includes: an opening on a front surface side; and a gas supply mechanism on a bottom surface. The gas supply mechanism has: an introduction path configured to receive a gas from a bottom surface side; a check valve disposed at a position that does not overlap with the introduction path in a horizontal plane along the bottom surface; and a flow path configured to supply the gas from the introduction path to the check valve.

Effects of Invention

This disclosure provides a substrate storage container configured such that a cleaning liquid does not readily remain in a gas supply mechanism.

DESCRIPTION OF EMBODIMENTS

Hereinafter, embodiments according to the disclosure will be described with reference to the accompanying drawings.

Figure 1:
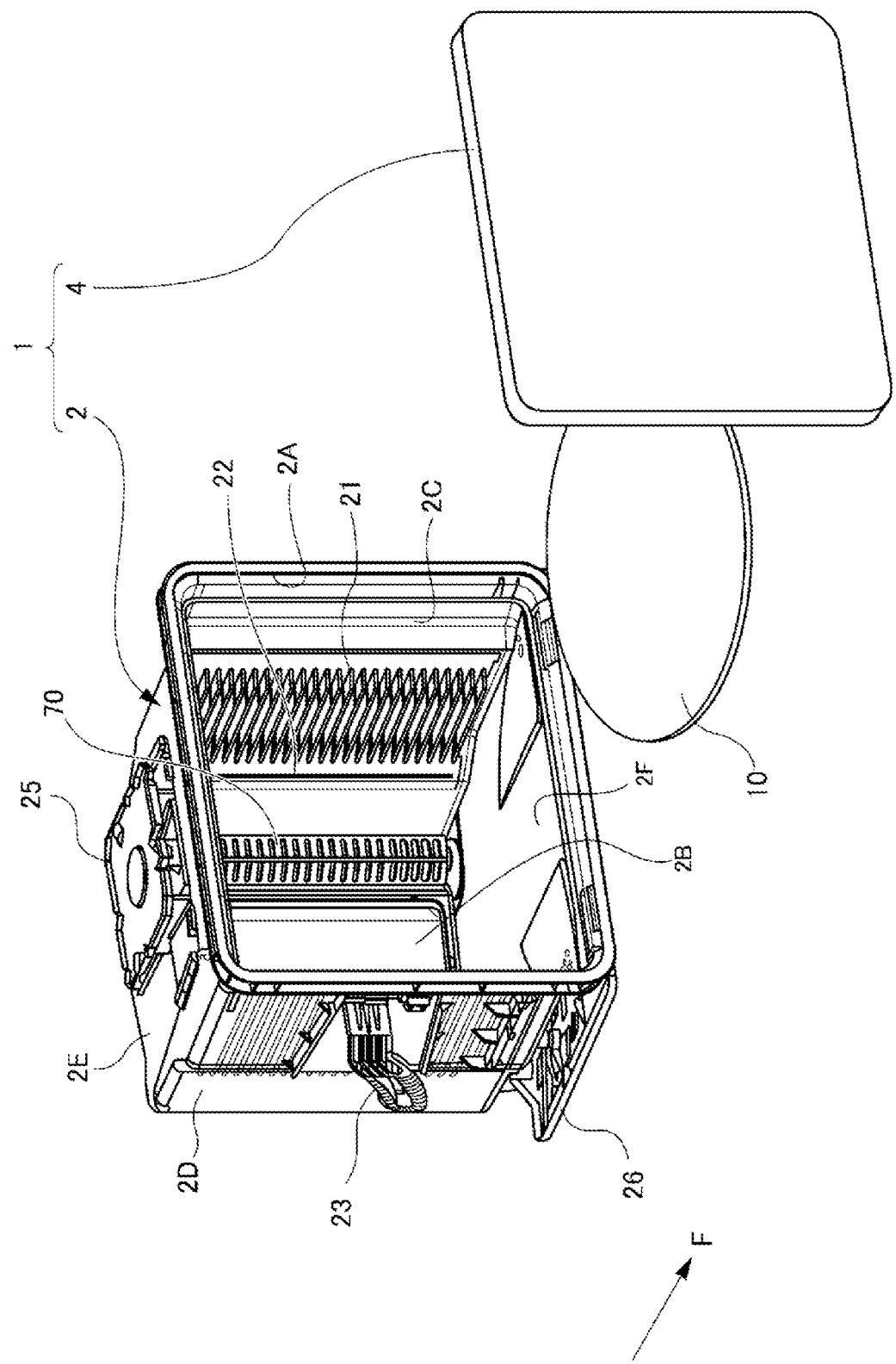
FIG. 1 is an exploded perspective view illustrating a substrate storage container of an embodiment.
Figure 2:
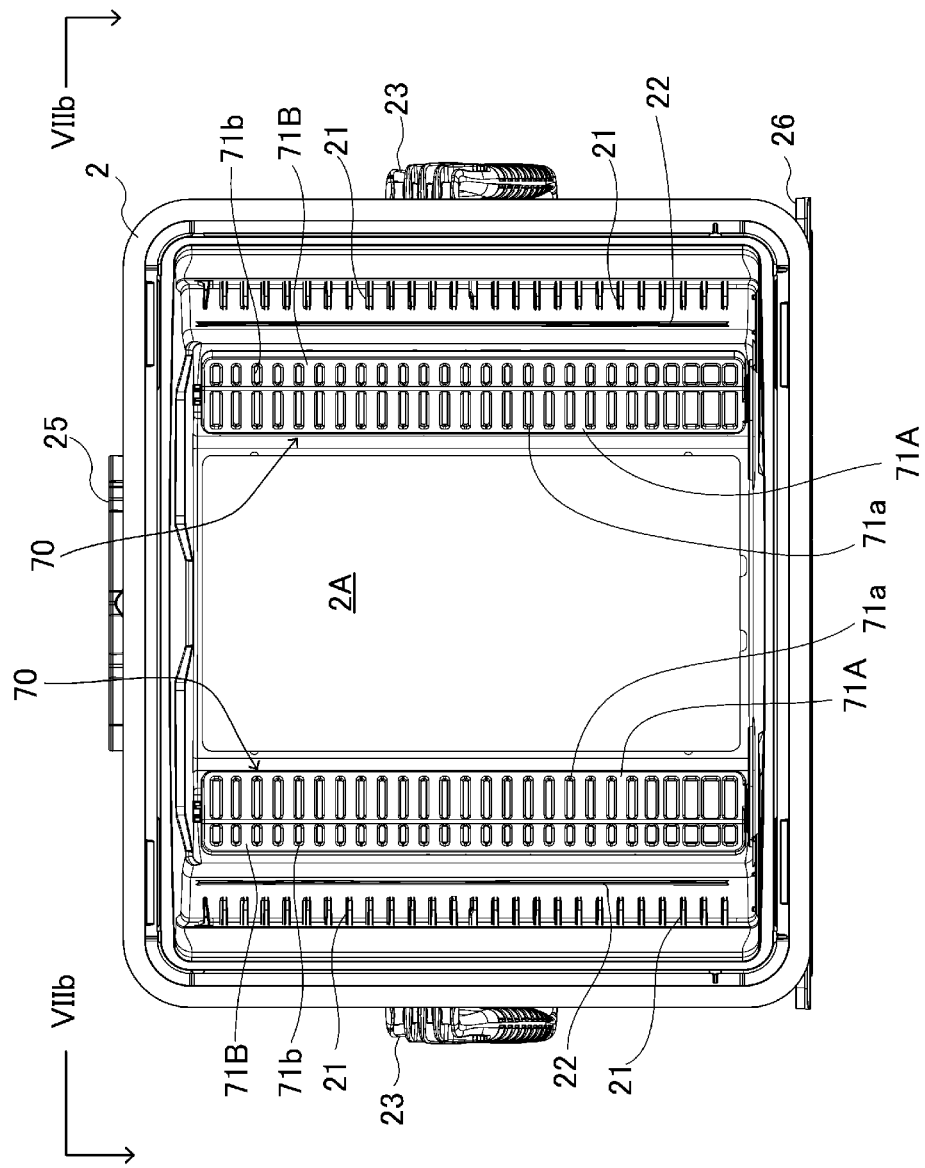
FIG. 2 is a front view illustrating a container body.

FIG. 1 is an exploded perspective view illustrating a substrate storage container of an embodiment. FIG. 2 is a front view illustrating a container body thereof.

As illustrated in FIG. 1, a substrate storage container 1 includes a container body 2 that stores a plurality of substrates 10 and a lid 4 that is attached to and detached from the container body 2. The substrates 10 may be any substrates such as semiconductor wafers or mask glass substrates having a diameter of 300 mm or 450 mm. Although any number of substrates 10 may be stored, this substrate storage container 1 can accommodate up to, for example, 25 substrates.

As illustrated in FIGS. 1 and 2, the container body 2 has an opening 2A on a front surface side, through which the substrates 10 are inserted into or taken out from the container body 2. The lid 4 can be attached to the opening 2A while maintaining the airtightness in the substrate storage container 1. In FIG. 1, an arrow F indicates the front surface side of the substrate storage container 1 or a forward direction. Hereinafter, the direction of the arrow F is referred to as the front surface side or the forward direction, and the direction opposite to the arrow F is referred to as a rear surface side or a backward direction.

The container body 2 has a rear wall 2B, a right side wall 2C, a left side wall 2D, a top surface 2E, and a bottom surface 2F on surfaces except the front surface side. The substrate storage container 1 has a substantially rectangular parallelepiped shape when the lid 4 is attached to the opening 2A of the container body 2. The substrate storage container 1 is a so-called front open box type container with the opening 2A on the front surface side.

Inside the container body 2, a plurality of support pieces 21 are attached on the right side wall 2C and the left side wall 2D. The number of support pieces 21 corresponds to the maximum number of substrates 10 that the substrate storage container 1 can accommodate. The support pieces 21 are provided vertically at equal intervals on the right side wall 2C and the left side wall 2D. Two support pieces 21 at the same height pair up to support a substrate 10 from both sides. Thus, the substrates 10 are horizontally stored in the container body 2.

Further, position regulating parts 22 are provided in pair on the right side wall 2C and the left side wall 2D respectively so as to extend vertically at positions on the rear surface side of the support pieces 21. The position regulating parts 22 regulate backward movement of the substrates 10 supported by the support pieces 21, thereby defining the positions of the substrates 10 in the forward and backward directions.

The container body 2 also includes accessories such as grips 23, a top flange 25 and a bottom plate 26 described below, which are appropriately attached to the container body 2.

The grips 23 can be respectively attached on outer circumferential surfaces of the right side wall 2C and the left side wall 2D of the container body 2 so as to be held in an operation. The top flange 25 can be attached on an upper surface of the top surface 2E of the container body 2. For example, the top flange 25 is gripped by a ceiling carrier in a semiconductor manufacturing factory for transportation of the substrate storage container 1 between processes or for positioning of the substrate storage container 1 on a semiconductor processing apparatus. The bottom plate 26 can be attached to the bottom surface 2F of the container body 2.

The container body 2, the lid 4 and the above-mentioned accessories (the grips 23, the top flange 25, the bottom plate 26, etc.) are formed by injection molding using resin-containing molding materials. Examples of the resin contained in the molding materials include thermoplastic resins such as polycarbonate, cycloolefin polymer, polyetherimide, polyetherketone, polybutyleneterephthalate, polyacetal and liquid crystal polymer, and alloys thereof.

These resins may include a conductive material such as a carbon fiber, carbon powder, carbon nanotube and conductive polymer; or an anionic, cationic or non-ionic antistatic agent as needed. The resins may further include an ultraviolet absorber, a reinforcement fiber that improves stiffness, or the like as needed.

Figure 3:
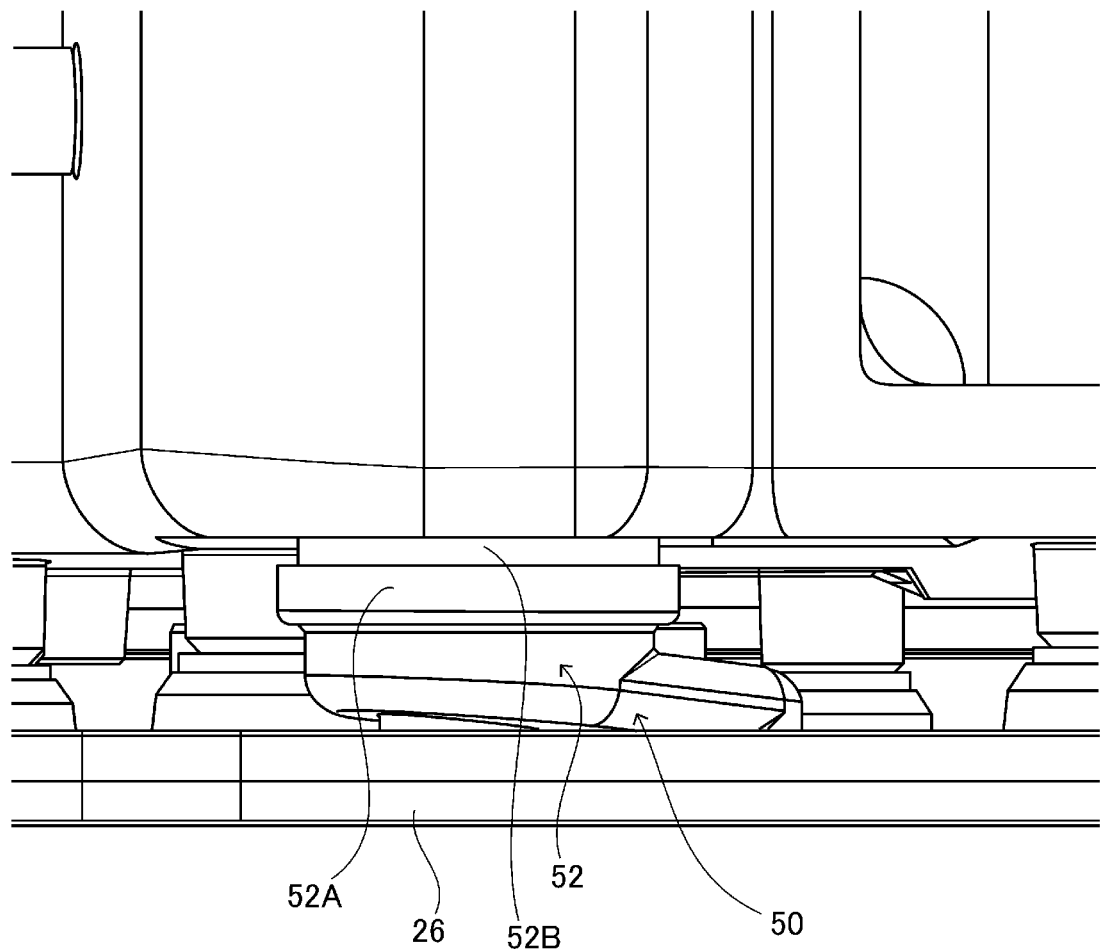
FIG. 3 is a perspective view illustrating a gas supply mechanism 50.
Figure 4:
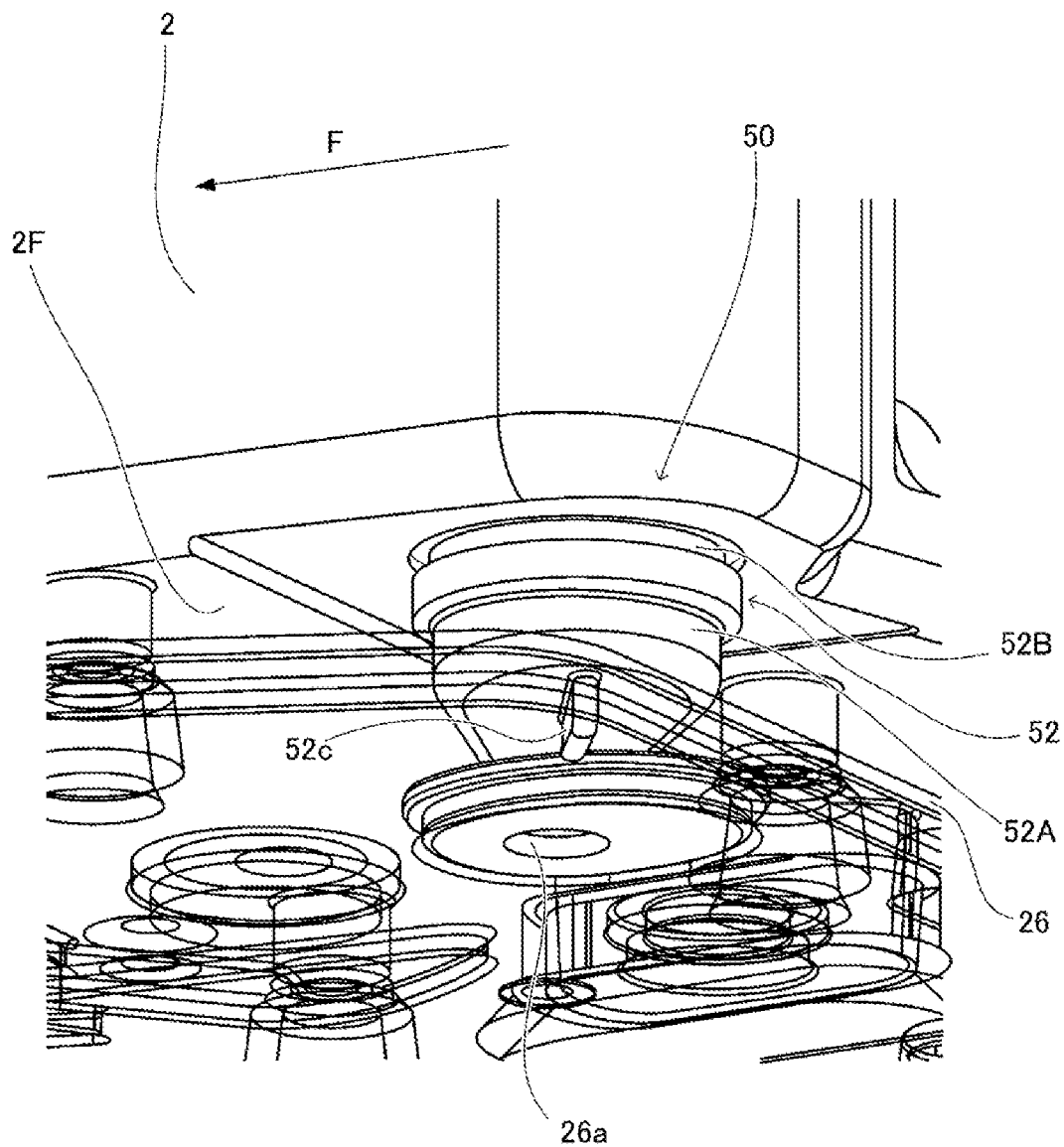
FIG. 4 is a perspective view illustrating the gas supply mechanism 50.
Figure 5:
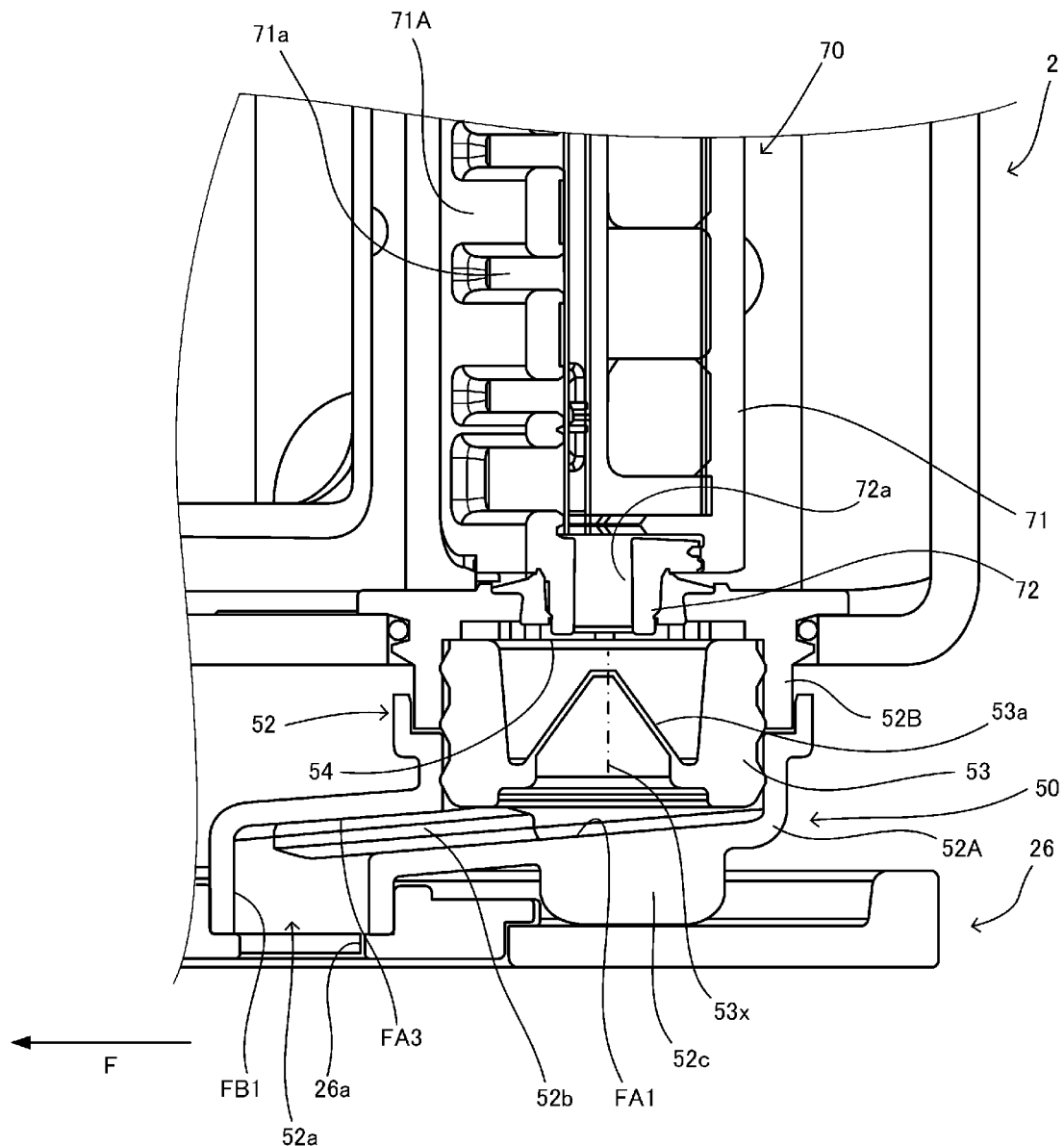
FIG. 5 is a vertical cross-sectional view illustrating the gas supply mechanism 50.
Figure 6:
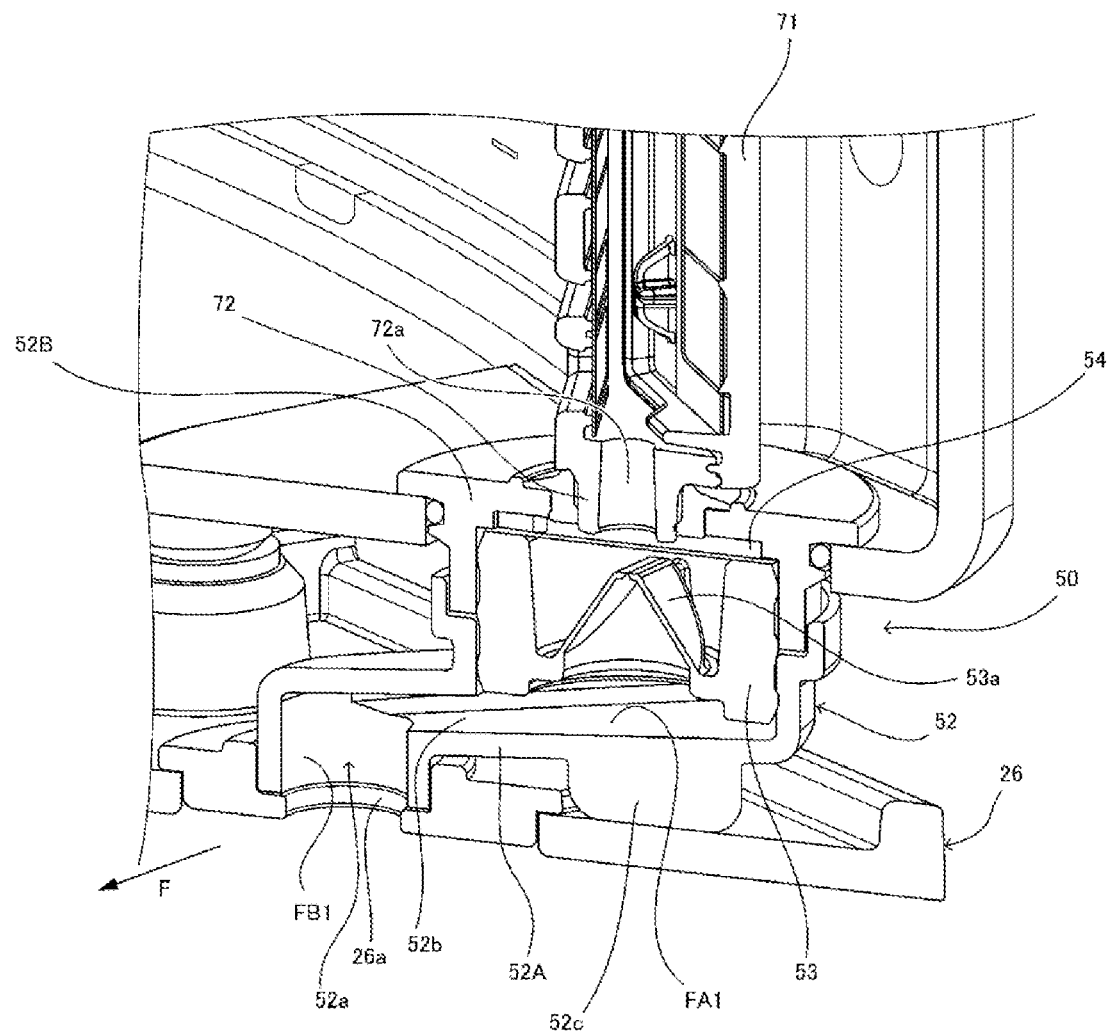
FIG. 6 is a cross-sectional perspective view illustrating the gas supply mechanism 50.

FIGS. 3 and 4 are perspective views illustrating a gas supply mechanism 50. FIG. 5 is a vertical cross-sectional view illustrating the gas supply mechanism 50. FIG. 6 is a cross-sectional perspective view illustrating the gas supply mechanism 50.

As illustrated in FIGS. 3 to 6, the gas supply mechanisms 50 are provided in pair on the right and left sides on the bottom surface 2F of the container body 2. Gas can be introduced into the interior of the substrate storage container 1 with the lid 4 closed from a gas displacement device (not illustrated) through the gas supply mechanisms 50. Note that FIGS. 3 and 4 illustrate the gas supply mechanism 50 on the right side when viewed from the front surface side. The left gas supply mechanism is symmetrical in shape to the right gas supply mechanism 50.

The gas supply mechanism 50 is connected to the gas replacement device to take a predetermined gas into the substrate storage container 1 from the gas replacement device through the gas supply mechanism 50. Thereby the air in the substrate storage container 1 can be replaced with the gas supplied. Incidentally, the bottom surface 2F of the container body 2 also has gas exhaust mechanisms (not illustrated). The gas inside the substrate storage container 1 is discharged through each gas exhaust mechanism into the gas replacement device so as to give place to the introduced gas, so that the interior of the substrate storage container 1 can be substantially completely filled with the desired gas.

The gas introduced in the substrate storage container 1 may be an inert gas or dry air, for example. The inert gas may be nitrogen gas or argon gas.

As illustrated in FIGS. 3 to 6, the gas supply mechanism 50 includes a flow path component 52 having a member 52A and a member 52B fitted in the member 52A; and a filter structure 53 accommodated in the flow path component 52.

The member 52A of the flow path component 52 includes an introduction path 52a penetrating in the vertical directions in FIG. 5; a flow path 52b communicating with the introduction path 52a and extending to a lower end of the filter structure 53; and a leg portion 52c.

In the filter structure 53, a check valve 53a is formed so as to allow the gas to move only in the gas supply direction. Normally, the check valve 53a is kept closed, preventing variations in the conditions of the gas filled in the container body 2 such as the composition of the gas or the humidity. The check valve 53a also works as a filter to prevent foreign matters such as dust from entering the substrate storage container 1.

The container body 2 is mounted at a predetermined position on the gas replacement device via the bottom plate 26. The leg portion 52c of the member 52A abuts on the bottom plate 26 to support the flow path component 52. A lower end of the member 52A fits in an opening 26a of the bottom plate 26 (a lower end on the left side in FIG. 5) so that the opening 26a and the introduction path 52a communicate with each other.

A breathable filter member 54 may be attached to the upper end of the filter structure 53 in FIG. 5 to remove foreign matters such as dust (FIGS. 5 and 6). The filter member 54 may be provided at any position downstream of the flow path 52b. The filter member may be provided upstream of the flow path 52b.

Figure 7A:
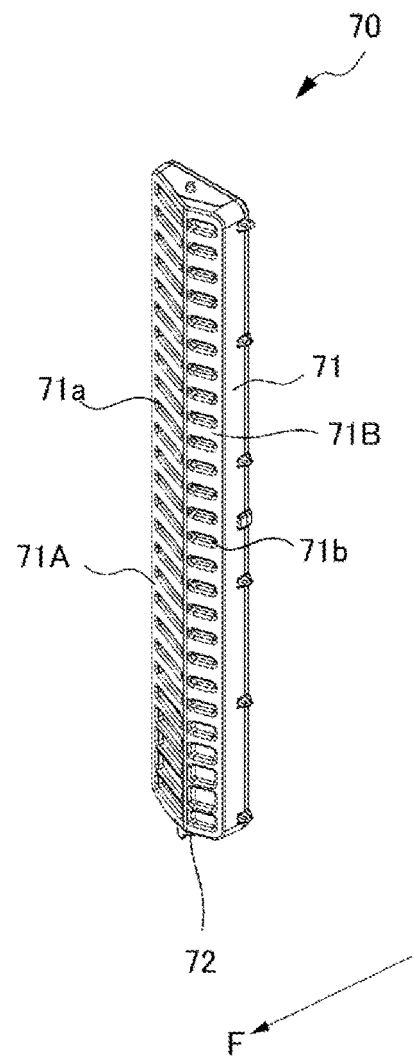
FIG. 7A is a perspective view illustrating a tower nozzle 70.

FIG. 7A is a perspective view illustrating a tower nozzle 70.

As illustrated in FIGS. 1, 2, 5 and 6, the tower nozzle 70 is attached in the container body 2 so as to extend vertically. As illustrated in FIG. 2, two tower nozzles 70 are provided in pair on the right and left sides respectively in the container body 2. The tower nozzles 70 are symmetrical in shape with each other.

Each tower nozzle 70 includes a housing 71 having an inner space (FIG. 6), in which the gas passes. The housing 71 has a surface 71A and a surface 71B. The surface 71A has a plurality of outlet ports 71a. The surface 71B has a plurality of outlet ports 71b. The interior of the housing 71 communicates with the interior space of the container body 2 via the outlet ports 71a and 71b. As an alternative form of the tower nozzle 70, the tower nozzle may have additional outlet ports on the rear surface side, from which the gas is blown out toward the rear surface side. As another alternative, the tower nozzle may be formed of a porous body made of a resin material. Further, any gas replacement unit in any shape can be used as an alternative to the tower nozzle 70. For example, the gas replacement unit may include a plate-shaped cover member with a plurality of outlet ports, from which the gas is blew out.

Figure 7B:
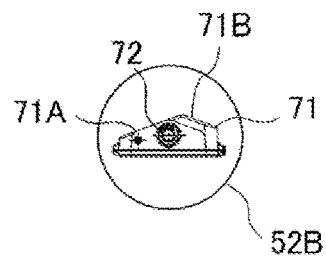
FIG. 7B is a top view illustrating a positional relationship between a communication section 72 and a member 52B of a filter structure 53 in a horizontal plane (a view seen from the direction of VIIb-VIIb in FIG. 2).

FIG. 7B is a top view illustrating a positional relationship between a communication section 72 and the member 52B of the filter structure 53 in a horizontal plane (a view seen from the direction of VIIb-VIIb in FIG. 2).

As illustrated in FIGS. 5, 6, 7A and 7B, the communication section 72 is provided at a lower end of the tower nozzle 70, and has a through hole 72a communicating with the interior of the housing 71. A center axis of the through hole 72a substantially coincides with a center axis 53x (FIG. 5) of the filter structure 53.

Next, the flow of the gas to be supplied into the interior of the container body 2 will be described.

The gas supplied from the gas replacement device is sequentially introduced through the opening 26a of the bottom plate 26 into the introduction path 52a, the flow path 52b, and the filter structure 53. When the pressure of the supplied gas opens the check valve 53a of the filter structure 53, the gas passes through the filter structure 53. The gas is then supplied to the interior of the housing 71 through the through hole 72a and ejected from the outlet ports 71a and 71b, thereby being diffused in the container body 2.

In this embodiment, the flow path 52b of the gas supply mechanism 50 is provided between the introduction path 52a and the filter structure 53. Hence, the introduction path 52a is not positioned coaxially with the filter structure 53, and the check valve 53a is positioned so as not to overlap with the introduction path 52a in a horizontal plane along the bottom surface 2F. Accordingly, a cleaning liquid (water) is not directly sprayed to the filter structure 53 in the process of spraying the cleaning liquid to the container body 2. This reduces the possibility that the hydraulic pressure of the sprayed cleaning liquid opens the check valve 53a and the cleaning liquid passes through the filter structure 53.

The presence of the flow path 52b also reduces the possibility that the cleaning liquid comes near the vicinity of the filter structure 53.

Therefore, the cleaning liquid can be easily dried in the drying process of the cleaning liquid, which reduces the possibility that the cleaning liquid ends up remaining in the container body 2, in particular, in the area behind or around the filter structure 53.

Normally, in the process of drying the cleaning liquid, the opening 2A is directed downward to prevent the cleaning liquid from remaining inside the container body 2. In this embodiment, as illustrated in FIG. 4, the direction of the flow path 52b is set such that the cleaning liquid having entered into the flow path 52b flows through the flow path 52b toward the introduction path 52a due to the gravity acting thereon when the opening 2A is directed downward, i.e., when the front surface side indicated by the arrow F is directed downward. For example, the cleaning liquid adhering to wall surfaces (FIGS. 5 and 6) of the flow path 52b flows along a wall surface FA3 toward the introduction path 52a.

When the container body 2 is placed with the bottom surface 2F facing downward after drying, the opening of the introduction path 52a faces downward. Accordingly, the remaining cleaning liquid is easily discharged through the introduction path 52a. For example, the cleaning liquid adhering to a wall surface FB1 (FIGS. 5 and 6) of the introduction path 52a flows along the wall surface FB1 to the outside of the introduction path 52a.

Further, when the container body 2 is placed with the bottom surface 2F facing downward, the slope of the flow path 52b descends toward the introduction path 52a. Accordingly, the cleaning liquid remaining on the flow path 52b flows toward the introduction path 52a through the flow path 52b due to the gravity acting thereon. For example, the cleaning liquid adhering to a wall surface FA1 (FIGS. 5 and 6) of the flow path 52b flows along the wall surface FA1 toward the introduction path 52a.

Thus, the cleaning liquid remaining around the filter structure 53 can be easily discharged and dried during or after the drying process of the cleaning liquid. Therefore, even when the cleaning liquid enters the vicinity of the filter structure 53, the cleaning liquid can be easily discharged and dried.

Next, the configuration of another gas supply mechanism 150 will be described with reference to FIGS. 8 and 9.

Figure 8:
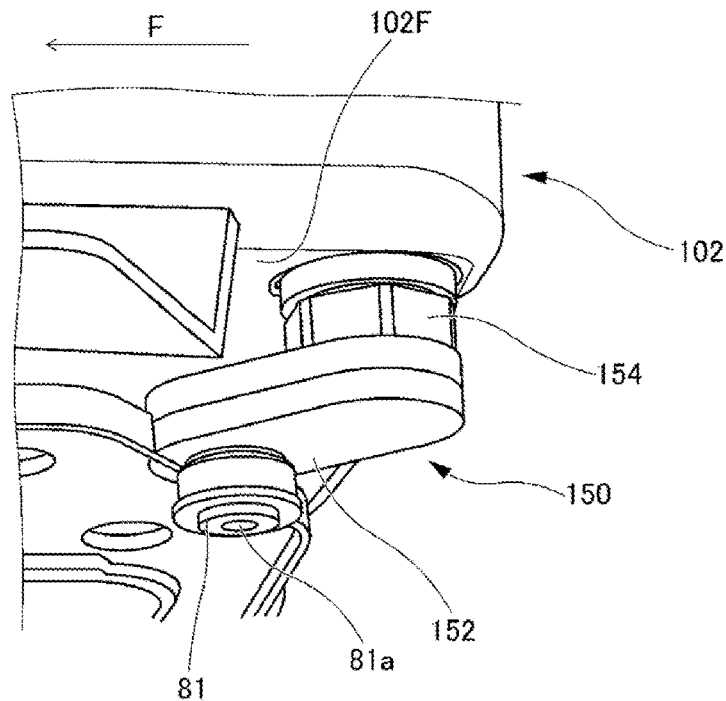
FIG. 8 is a perspective view illustrating a gas supply mechanism 150.

FIG. 8 is a perspective view illustrating the gas supply mechanism 150. FIG. 9 is a cross-sectional perspective view illustrating the gas supply mechanism 150.

Figure 9:
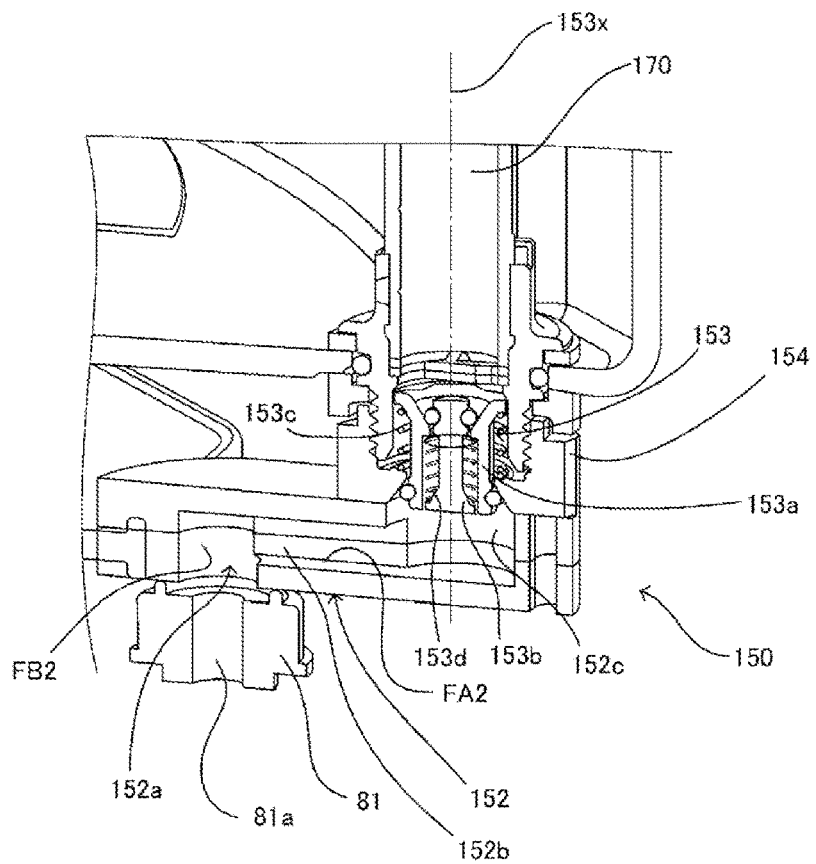
FIG. 9 is a cross-sectional perspective view illustrating the gas supply mechanism 150.

As illustrated in FIGS. 8 and 9, the gas supply mechanism 150 includes a flow path component 152 to be connected to an introduction section 81 of the gas replacement device, a filter structure 153 to be connected to the flow path component 152, and an attachment member 154 to attach the filter structure 153 to a container body 102.

The introduction section 81 of the gas replacement device has a through hole 81a penetrating therethrough in the vertical directions in FIG. 9. The flow path component 152 includes an introduction path 152a communicating with the through hole 81a and extending in the vertical directions in FIG. 9, a flow path 152b communicating with the introduction path 152a and extending in a direction along a bottom surface 102F of the container body 102, and a flow path 152c communicating with the flow path 152b and extending in the vertical directions in FIG. 9.

The filter structure 153 has a valve body 153a and a valve body 153b which are movable in the vertical directions in FIG. 9. The valve body 153a is biased in the upward direction in FIG. 9 by a spring 153c compressed between the attachment member 154 and the valve body 153a. The valve body 153b is biased in the downward direction in FIG. 9 by a spring 153d compressed between the valve body 153a and the valve body 153b. This enables the filter structure 153 to work as a check valve that allows the flow of gas in both directions of gas supply and gas discharge to and from the container body 102, i.e., as a bi-directional valve. The check valve of the filter structure 153 is kept closed when the difference in gas pressure is small between the inside and outside of the substrate storage container (the container body 102), which prevents variations in the conditions of the gas filled in the substrate storage container such as the composition of the gas or the humidity. The filter structure 153 also works as a filter to prevent foreign matters such as dust from entering the substrate storage container.

A breathable filter member (not illustrated) may be attached to the upper end of the filter structure 153 in FIG. 9 to remove foreign matters such as dust.

Cylindrical tower nozzles 170 are provided in the container body 102 so as to extend in the vertical directions in FIG. 9. A center axis of each tower nozzle 170 extending vertically in FIG. 9 coincides with a center axis 153x of the filter structure 153. Outlet ports (not illustrated) are formed in a predetermined part of a side surface of the tower nozzle 170. The outlet ports may be provided at equal intervals in the vertical directions in FIG. 9, for example. The gas to be supplied into the substrate storage container is diffused through these outlet ports.

Next, the flow of gas to be supplied into the substrate storage container (the container body 102) will be described.

The gas supplied through the introduction path 152a is introduced via the through hole 81a, the flow path 152b and the flow path 152c into the filter structure 153. When the pressure of the supplied gas pushes the valve body 153b of the filter structure 153 in the upward direction in FIG. 9, the gas flows between the valve body 153a and the valve body 153b into the tower nozzle 170, from which the gas is diffused into the substrate storage container.

As described above, the gas supply mechanism 150 includes the flow path 152b as a flow path for supplying the gas into the substrate container body; the introduction path 152a is not positioned coaxially with the filter structure 153; and the filter structure 153 is positioned so as not to overlap with the introduction path 152a in a horizontal plane along the bottom surface 102F. Accordingly, the cleaning liquid (water) does not directly reach the filter structure 153 in the process of spraying the cleaning liquid to the container body 102. This reduces the possibility that the hydraulic pressure of the sprayed cleaning liquid pushes the valve body 153b and the cleaning liquid passes through the filter structure 153.

The presence of the flow path 152b also reduces the possibility that the cleaning liquid comes near the vicinity of the filter structure 153.

Therefore, the cleaning liquid can be easily dried in the drying process of the cleaning liquid, which reduces the possibility that the cleaning liquid ends up remaining in the container body 102, in particular, in the area behind or around the filter structure 153.

Normally, in the process of drying the cleaning liquid, the opening (not illustrated, corresponding to the opening 2A in FIG. 1) is directed downward to prevent the cleaning liquid from remaining inside the container body 102. As illustrated in FIG. 9, the direction of the flow path 152b is set such that the cleaning liquid having entered into the flow path 152b flows through the flow path 152b toward the introduction path 152a due to the gravity acting thereon when the opening is directed downward, i.e., when the front surface side indicated by the arrow F in FIG. 8 is directed downward. For example, the cleaning liquid adhering to a wall surface FA2 (FIG. 9) of the flow path 152b flows along the wall surface FA2 toward the introduction path 152a.

When the container body 102 is placed with the bottom surface 102F facing downward after drying, the opening of the introduction path 152a faces downward. Accordingly, the remaining cleaning liquid is easily discharged through the introduction path 152a. For example, the cleaning liquid adhering to a wall surface FB2 (FIG. 9) of the introduction path 152a flows along the wall surface FB2 to the outside of the introduction path 152a.

Thus, the cleaning liquid remaining around the filter structure 153 can be easily discharged and dried during or after the drying process of the cleaning liquid. Therefore, even when the cleaning liquid enters the vicinity of the filter structure 153, the cleaning liquid can be easily discharged and dried.

The present disclosure has been described in detail with reference to the exemplary embodiments above, but it is not limited to specific embodiments. Various variations and modifications can be made within the scope of the appended claims. It is also possible to combine all or some of the components of the embodiments described above.

Reference Signs List

1: substrate storage container
2: container body
2A: opening
2F: bottom surface
50: gas supply mechanism
52a: introduction path
52b: flow path
53a: check valve
53: filter structure (a member with a check valve)
54: filter member
102: container body
102F: bottom surface
150: gas supply mechanism
152a: introduction path
152b: flow path
153: filter structure (a check valve, a member with a check valve)

The invention claimed is:

1. A substrate storage container, comprising:
an opening on a front surface side; and
a gas supply mechanism on a bottom surface, wherein the gas supply mechanism comprises:
    an introduction path configured to receive a gas from a bottom surface side;
    a check valve disposed at a position that does not overlap with the introduction path in a direction perpendicular to the bottom surface; and
    a flow path extending between the introduction path and the check valve and configured to supply the gas from the introduction path to the check valve.

2. The substrate storage container according to claim 1, wherein the flow path is formed in a member that is different from a member provided with the check valve.

3. The substrate storage container according to claim 1, wherein the gas supply mechanism comprises a filter member disposed downstream of the flow path.

4. The substrate storage container according to claim 1, wherein
the introduction path is disposed on the front surface side from the check valve, and
the flow path has a wall surface on which a cleaning liquid in the flow path flows to the introduction path by gravity when the front surface side is directed downward.

5. The substrate storage container according to claim 1, wherein the flow path has a wall surface on which a cleaning liquid in the flow path flows to the introduction path by gravity when the bottom surface is directed downward.

6. The substrate storage container according to claim 1, wherein the introduction path has a wall surface on which a cleaning liquid in the introduction path flows to outside of the introduction path by gravity when the bottom surface is directed downward.

7. The substrate storage container according to claim 1, wherein the check valve is a bidirectional valve.

* * * * *